(12) United States Patent
Sohma et al.

(10) Patent No.: US 9,096,440 B2
(45) Date of Patent: Aug. 4, 2015

(54) METHOD OF PRODUCING SUPERCONDUCTIVE OXIDE MATERIAL

(75) Inventors: Mitsugu Sohma, Tsukuba (JP); Tetsuo Tsuchiya, Tsukuba (JP); Toshiya Kumagai, Tsukuba (JP); Kenichi Tsukada, Tsukuba (JP); Kunihiko Koyanagi, Yokohama (JP); Takashi Ebisawa, Yokohama (JP); Hidehiko Ohtu, Yokohama (JP)

(73) Assignees: NATIONAL INSTITUTE OF ADVANCED INDUSTRIAL SCIENCE AND TECHNOLOGY, Tokyo (JP); THE JAPAN STEEL WORKS, LTD., Tokyo (JP)

( * ) Notice: Subject to any disclaimer, the term of this patent is extended or adjusted under 35 U.S.C. 154(b) by 1686 days.

(21) Appl. No.: 12/083,650

(22) PCT Filed: Jul. 31, 2007

(86) PCT No.: PCT/JP2007/064922
§ 371 (c)(1),
(2), (4) Date: Apr. 15, 2008

(87) PCT Pub. No.: WO2008/018314
PCT Pub. Date: Feb. 14, 2008

(65) Prior Publication Data
US 2009/0156411 A1 Jun. 18, 2009

(30) Foreign Application Priority Data
Aug. 10, 2006 (JP) .................................. 2006-217678

(51) Int. Cl.
*B05D 5/12* (2006.01)
*C01G 1/02* (2006.01)
(Continued)

(52) U.S. Cl.
CPC ........ *C01G 1/02* (2013.01); *C01G 3/006* (2013.01); *C23C 18/1216* (2013.01);
(Continued)

(58) Field of Classification Search
USPC ........ 427/62, 554–556; 29/599; 505/325, 480
See application file for complete search history.

(56) References Cited

U.S. PATENT DOCUMENTS 4,997,809 A * 3/1991 Gupta ........................... 505/410
5,310,990 A * 5/1994 Russell et al. ........... 219/121.69
(Continued)

FOREIGN PATENT DOCUMENTS

| CN | 2527572 Y | 12/2002 |
|---|---|---|
| JP | 64-035806 | 2/1989 |
| JP | 64-35806 * | 2/1989 |
| JP | 01-115823 | 5/1989 |
| JP | 01-294506 | 11/1989 |

(Continued)

OTHER PUBLICATIONS

"Excimer Laser Assist MOD-ho ni yoru YBCO no Kosoku-Teion Seimaku", by Mitsugu SOMA, Extended abstracts; the Japan Society of Applied Physics, 67$^{th}$, Aug. 2006, p. 252.

*Primary Examiner* — Brian K Talbot
(74) *Attorney, Agent, or Firm* — Flynn, Thiel, Boutell & Tanis, P.C.

(57) ABSTRACT

A method of producing a superconductive material involves the step (1) of applying a solution of an organic compound of metals and oxides of the metals forming a superconductive material, onto a support body to be subsequently dried, the provisional baking step (2) of causing organic components of the organic compound of the metals to undergo thermal decomposition, and the main baking process step (3) of causing transformation of the oxides of the metals into the superconductive material, thereby producing an epitaxially-grown superconductive coating material, wherein the support body is irradiated with the laser light during a period between the steps (1) and (2) from a surface of the support body, on the opposite side of the surface coated with the solution of the organic compound of the metals for forming the superconductive material.

7 Claims, 5 Drawing Sheets

(51) Int. Cl.
*C01G 3/00* (2006.01)
*C23C 18/12* (2006.01)
*C23C 18/14* (2006.01)
*C30B 7/02* (2006.01)
*C30B 29/22* (2006.01)
*H01L 39/24* (2006.01)

(52) U.S. Cl.
CPC ........ *C23C 18/1283* (2013.01); *C23C 18/1291* (2013.01); *C23C 18/14* (2013.01); *C30B 7/02* (2013.01); *C30B 29/22* (2013.01); *H01L 39/2425* (2013.01); *H01L 39/2451* (2013.01); *C01P 2002/82* (2013.01); *C01P 2006/40* (2013.01)

(56) References Cited

U.S. PATENT DOCUMENTS

| | | | |
|---|---|---|---|
| 6,576,302 B1 * | 6/2003 | Yamaguchi et al. | 427/597 |
| 6,887,770 B2 * | 5/2005 | Ueda et al. | 438/455 |

FOREIGN PATENT DOCUMENTS

| | | |
|---|---|---|
| JP | 05-147941 | 6/1993 |
| JP | 05-262597 | 10/1993 |
| JP | 07-106905 | 11/1995 |
| JP | 2759125 | 3/1998 |
| JP | 2000-256862 | 9/2000 |
| JP | 2001-031417 | 2/2001 |
| JP | 2007-070216 | 3/2007 |

* cited by examiner

METHOD OF PRODUCING SUPERCONDUCTIVE OXIDE MATERIAL

TECHNICAL FIELD

The invention relates to a method of producing a superconductive material for use in the fields of power transmission, power equipment, and information equipment, and in particular, to a method of producing a superconductive film (such as a fault current limiter, a microwave filter, wires and tapes).

BACKGROUND TECHNOLOGY

In the past, a substrate has been coated with a solution of an organic compound containing metal elements of which a superconductive material is formed to be subsequently dried (1), and thereafter, a process step (2) (provisional baking) for executing decomposition of the organic components, and a process step (3) (main baking) for forming the superconductive material have all been executed by the agency of thermal energy (refer to Patent Document 1).

Further, there has been known a method of producing metal oxides, and metal oxide thin films by use of an excimer laser (refer to Patent Document 2), characterized in that when preparing metal oxides (exhibiting no superconductivity), metal salts of organic acids, or metalorganic compounds $M_m R_n$ (provided that M=Si, Ge, Pb, Sn among the group 4b elements, Cr, Mo, W among the group 6a elements, and Mn, Tc, Re among the group 7a elements; R=an alkyl group such as $CH_3$, $C_2H_5$, $C_3H_7$, $C_4H_9$, etc., a carboxyl group such as $CH_3COO.$, $C_2H_5COO.$, $C_3H_7COO.$, $C_4H_9COO.$, etc., or a carbonyl group of CO; m, n: integers) are dissolved in a soluble solvent (or if those are in liquid form, as they are), and a solution thus obtained is dispersed and applied over a substrate before the substrate is irradiated in an oxygen atmosphere with an excimer laser light.

Still further, there has been known a method of producing metal oxides, which is a method of producing metal oxides (exhibiting no superconductivity) on a substrate without applying heat treatment at a high temperature unlike a conventional case known as the coating thermal decomposition method, characterized in that metalorganic compounds (metal salts of organic acids, metal-acetylacetonate, metal-alkoxides containing an organic group having 6 or more carbon atoms) are dissolved in a solvent to be turned into a solution, and the substrate is coated with the solution to be subsequently dried, thereby forming metal oxides on the substrate by irradiating the substrate with laser light at a wavelength not more than 400 nm (Patent Document 3). Herein, there has been described the method of producing metal oxides, characterized in that the metalorganic compounds are dissolved in a solvent to be turned into a solution, and the substrate is coated with the solution to be subsequently dried, thereby forming metal oxides on the substrate by irradiating the substrate with the laser light at a wavelength not more than 400 nm such as, for example, an excimer laser beam selected from the group consisting of excimer laser beams ArF, KrF, XeCl, XeF, and $F_2$, and further, it has been described therein that irradiation with the laser light at the wavelength not more than 400 nm is executed in a plurality of stages, and weaker irradiation on the order of not causing complete decomposition of the metalorganic compounds is executed in the initial stage of the irradiation while executing stronger irradiation capable of converting the metalorganic compounds into the metal oxides in the next stage. Further, it is also known that the metalorganic compounds are not less than two kinds of compounds, each containing a different metal, the metal oxides obtained are composite oxides containing various metals, and respective metal constituents of the metal salts of the organic acids are elements selected from the group consisting of iron, indium, tin, zirconium, cobalt, nickel, and lead.

Still further, with a method of producing composite oxide films, whereby a precursor coating liquid containing raw material constituents of respective oxides of La, Mn, and any of Ca, Sr, and Ba is applied to a surface of a material to be coated to thereby form a film, and subsequently, a thin film formed on the surface of the material to be coated is caused to undergo crystallization to thereby form composite oxide films (exhibiting no superconductivity) having the perovskite structure expressed by a composition formula $(Ls_{1-x} M_x)MnO_{3-\delta}$(M: Ca, Sr, Ba, $0.09 \leq x \leq 0.50$), there has been known a method of producing composite oxide films (refer to Patent Document 4) characterized in that the precursor coating liquid is applied to the surface of the material to be coated to thereby form a film, and subsequently, a thin film formed on the surface of the material to be coated is irradiated with light at a wavelength not more than 360 nm to thereby crystallize the thin film. Herein, it is further described that as a light source for irradiating the thin film formed on the surface of the material to be coated with light, use is made of a third harmonic light of an ArF excimer laser, KrF excimer laser, XeCl excimer laser, XeF excimer laser, and YAG laser, or a fourth harmonic light of the YAG laser, and the precursor coating liquid to be applied to the surface of the material to be coated is prepared by mixing an alkanolamine coordination compound of La, Mn carboxylate, and metal M or M alkoxide together in a first alcohol having carbon atoms in a range of 1 to 4.

The inventor has been faced with the fact that with the conventional method of producing a superconductive material, a long time was required, orientation was difficult to control and, further, uniformity underwent deterioration due to the occurrence of a reaction with a support body in practical use when carrying out the thermal decomposition of metalorganic compounds, and formation of a superconductive material by means of heat treatment, and in order to overcome problems, the inventor has succeeded in finding a method of efficiently producing a superconductive material excellent in performance upon execution of the thermal decomposition of the metalorganic compounds, and the formation of the superconductive material by means of the heat treatment, and has already submitted a Japanese Patent Application (refer to Patent Document 5). More specifically, such a method is a method of producing a superconductive material, characterized in that laser light is irradiated between the step of applying a solution of an organic compound containing metals, oxides of the metals forming a superconductive material, onto a support body to be subsequently dried (1), and the provisional baking step of causing organic components of the organic compound containing the metals to undergo thermal decomposition (2). The superconductive material obtained by the method according to this invention is superior in production efficiency, suitable for mass production, and excellent in superconductivity, however, in the case of a $YBa_2Cu_3O_7$ (YBCO) film about 100 nm in film thickness, the upper limit of the critical current density has been found to be on the order of $Jc=2.0$ $MA/cm^2$ at most. Furthermore, with this invention, only a surface of a substrate, coated with the solution of the organic compound containing the metals for forming the superconductive material on the substrate, is simply irradiated with laser light.

Patent Document 1: JP-07-106905-B
Patent Document 2: JP-2759125-W, Specification Patent Document 3: JP-2001-31417-A
Patent Document 4: JP-2000-256862-A
Patent Document 5: JP application 2006-185934

DISCLOSURE OF THE INVENTION

With the conventional method of producing a superconductive material, when carrying out the thermal decomposition of a metalorganic compound and formation of a superconductive material with heat treatment, a long time was required, orientation was difficult to control, and uniformity underwent deterioration due to the occurrence of a reaction with a support body in practical use. It is an object of the present invention to provide a method of efficiently producing a superconductive material more excellent in properties and larger in area when executing thermal decomposition of a metalorganic compound, and formation of a superconductive material with heat treatment.

Figure 1:
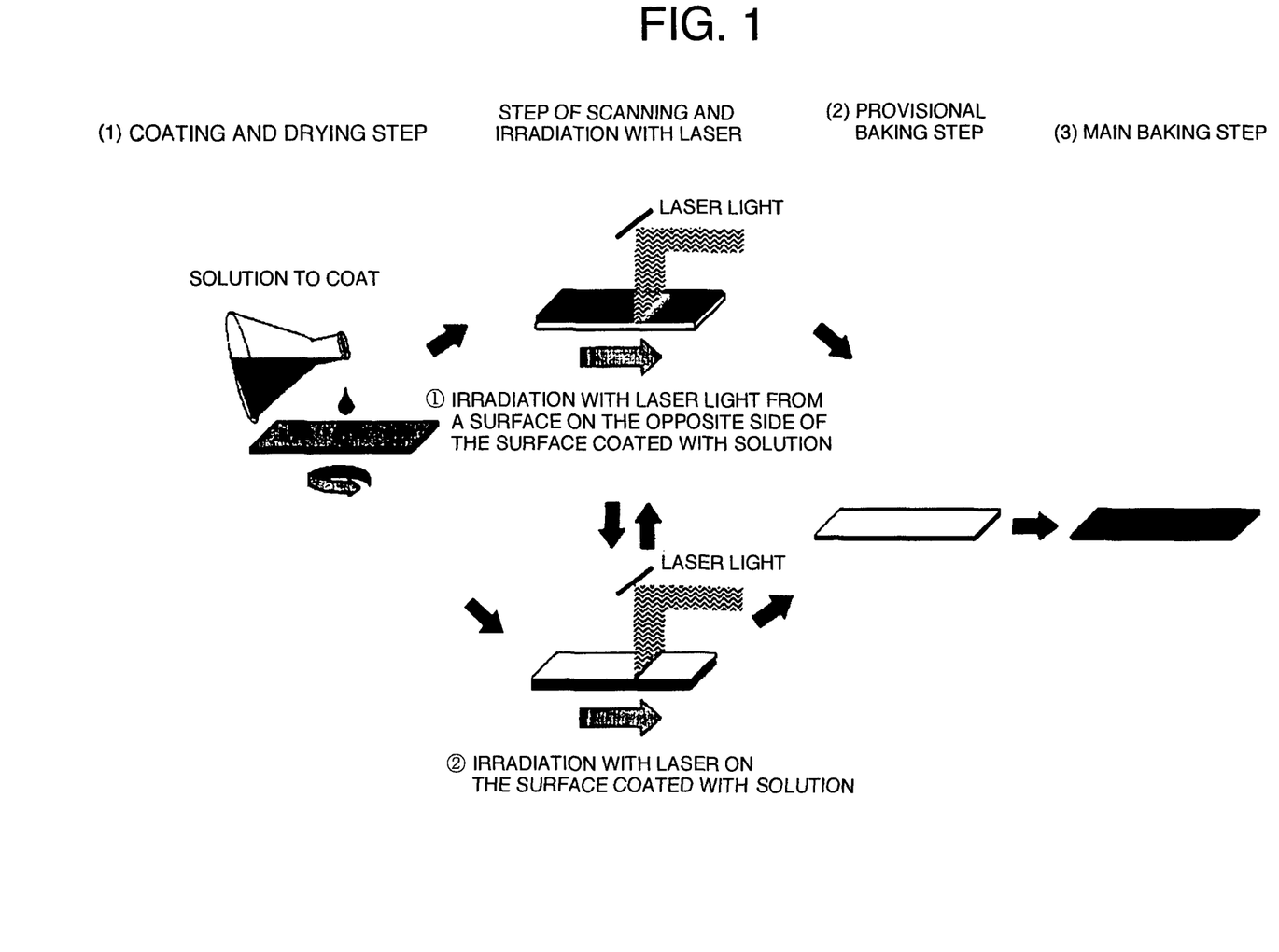
FIG. 1 is a schematic illustration showing a typical embodiment of a method of producing a superconductive material according to the present invention.

In order to attain the described object, with the method of producing a superconductive material according to the present invention, a part of a heat treatment process of a coating thermal decomposition method is replaced with irradiation with laser light. More specifically, in accordance with a first aspect of the invention, there is provided a method of producing a superconductive material comprising the step (1) of applying a solution of an organic compound of metals, oxides of the metals forming a superconductive material, onto a support body to be subsequently dried, a provisional baking step (2) of causing the organic components of the organic compound of the metals to undergo thermal decomposition and a main baking process step (3) of causing transformation of the oxides of the metals into the superconductive material, as shown in FIG. 1, thereby producing a superconductive coating material, wherein the support body is irradiated with the laser light during a period between the steps (1) and (2) from a surface of the support body, on the opposite side of the surface coated with the solution of the organic compound of the metals for forming the superconductive material. Further, the surface coated with the solution of the organic compound of the metals for forming the superconductive material may be irradiated with the laser light before, or after the support body is irradiated with the laser light from the surface of the support body, on the opposite side of the surface coated with the solution of the organic compound of the metals for forming the superconductive material.

Still further, the total energy ranging from a condition where a change in color appears on the surface to a condition where cracks occur on the surface is preferably irradiated with the laser light.

Yet further, upon irradiation with the laser light, a laser beam is preferably set to an intensity in a range of 10 to 100 mJ/cm$^2$ to thereby execute irradiation by scanning the laser light.

Further, in accordance with a second aspect of the invention, there is provided a method of producing a superconductive material comprising the step (1) of applying a solution of an organic compound of metals and oxides of the metals forming a superconductive material onto a support body to be subsequently dried, a provisional baking step (2) of causing the organic components of the organic compound of the metals to undergo thermal decomposition, and a main baking process step (3) of causing transformation of the oxides of the metals into the superconductive material, subsequently producing a superconductive coating material having undergone epitaxial growth, wherein upon irradiation of a surface of the support body coated with the solution of the organic compound of metals, forming the superconductive material, with laser light during a period between the steps (1) and (2), the laser light being set to an intensity in a range of 0.5 to 20 mJ/cm$^2$, the irradiation being started with laser light of a low intensity to be followed by irradiation with laser light of a high intensity.

Yet further, in accordance with a third aspect of the invention, there is provided a method of producing a superconductive material comprising the step (1) of applying a solution of an organic compound of metals, oxides of the metals forming a superconductive material onto a support body to be subsequently dried, a provisional baking step (2) of causing organic components of the organic compound of the metals to undergo thermal decomposition, and a main baking process step (3) of causing transformation of the oxides of the metals into the superconductive material, subsequently producing a superconductive coating material having undergone epitaxial growth, wherein upon irradiation of a surface of the support body, coated with the solution of the organic compound of metals forming the superconductive material, with laser light during a period between the steps (1) and (2), the laser light is set to an intensity in a range of 10 to 20 mJ/cm$^2$ to thereby execute irradiation by scanning the laser light. In this case, use may be made of a laser light of no less than 30000 in the number of pulses.

Since the method of producing a superconductive material according to the present invention is provided with a prerequisite for the invention described, it is possible to implement high-speed production (significant reduction in heat treatment time) of a film made of a superconductive material having excellent properties and a large area, and to concurrently execute patterning necessary for manufacturing devices of a microwave filter, a fault current limiter, and so forth, by use of a mask and accurate control of a position to be irradiated with laser light.

Further, with the present invention, as metals, oxides thereof for forming a superconductive material, selection can be made of at least one element selected from the group consisting of RE (RE refers to Y, and rare earth element), and AE (AE refers to alkaline earth metals), respectively, and Cu. Still further, with the present invention, as the support body, selection may be made of one single crystal substrate selected from the group consisting of lanthanum aluminate substrate, strontium titanate substrate, lanthanum-strontium-tantalum-aluminum oxide substrate, neodymium gallate substrate, and yttrium aluminate substrate.

Yet further, with the present invention, as the support body, selection may be made of one single crystal substrate selected from the group consisting of an aluminum oxide substrate, a yttria-stabilized zirconia substrate, a magnesium oxide substrate, the lanthanum aluminate substrate, strontium titanate substrate, lanthanum-strontium-tantalum-aluminum oxide substrate, neodymium gallate substrate, and yttrium aluminate substrate, each with a cerium oxide buffer layer formed thereon (by means of vapor deposition, sputtering, pulsed laser deposition, a coating thermal decomposition method, coating photodecomposition method, sol-gel method, and so forth).

Further, with the present invention, as the organic compound of metals, use may be made of at least one organic compound selected from the group consisting of β-diketonate, metal-alkoxides, and metal salts of organic acids that can include a halogen.

With those features, the method of producing a superconductive material according to the invention is excellent in production efficiency, suitable for mass production and capable of providing a superconductive material of superconductivity significantly improved, having a large area.

BEST MODE FOR CARRYING OUT THE INVENTION

Figure 2:
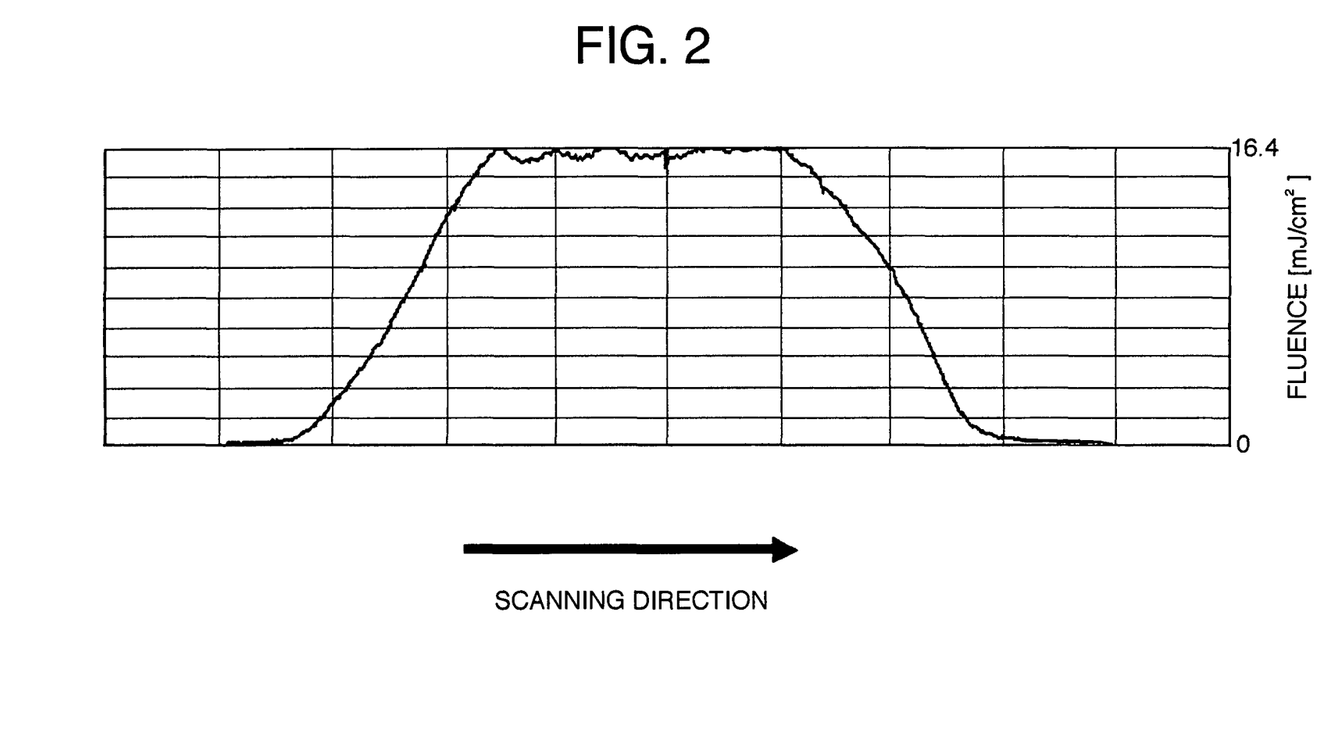
FIG. 2 is a diagram showing a line profile of fluence of a laser beam.
Figure 3:
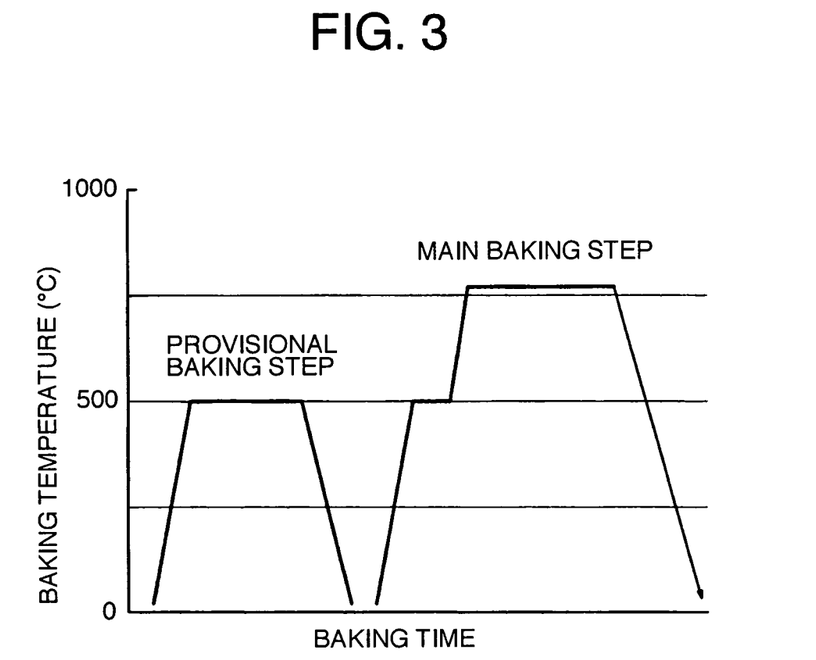
FIG. 3 is a diagram showing an example of a temperature profile in a baking process after a coating and drying process according to the present invention.

FIG. 1 shows a typical embodiment according to the present invention. In the figure, there is shown a method of producing a superconductive material, characterized in that a solution of an organic compound of metals for forming a superconductive material is applied to a surface of a support body, and at the time of irradiation of the support body with laser light during a period between a drying process step and a provisional baking process step, the support body is irradiated with the laser light from a surface of the support body, on the opposite side of the surface coated with the solution of the organic compound of the metals for forming the superconductive material. With the present invention, the laser light is preferably used in the form of a light beam processed by a beam homogenizer, and so forth to be used for scanning. As shown in FIG. 2, a line profile of the fluence of the light beam as processed is divided into sloped parts at respective ends of the line profile, and a central part where energy is uniform and intense. It has been found out that if the surface coated with the solution of the organic compound is continuously irradiated with a laser light beam having such a fluence profile as described while the laser light beam scanning the surface coated with the solution of the organic compound from a low value to a high value in terms of energy fluence, this will enable decomposition of organic material to adequately proceed to thereby obtain a high quality superconductor. This scanning irradiation is excellent in production efficiency, suitable for mass production, and effective in obtaining a superconductive material having an excellent superconductivity and a large area. With the present invention, it has been confirmed that the irradiation of the organic compound with the laser light has an effect of cleaving molecular bonds of the organic compound and it is presumed that attachments, such as a solvent and so forth, incorporated in the organic compound are first caused to undergo evaporation by the agency of a low energy region of the laser light beam according to the invention, followed by cleavage of the molecular bond of the organic compound by the agency of a high energy region of the laser light beam. The inventor has found out for the first time that such a phenomenon as described is quite effective in a method of production of a superconductive material having an excellent superconductivity, making use of the decomposition of the organic compound. Accordingly, with the present invention, an organic compound film over a substrate is first irradiated with a laser light beam of an intensity at about 1 mJ/cm$^2$, preferably a laser light beam of an intensity in a range of 0.5 to 2 mJ/cm$^2$, and subsequently, the organic compound film over the substrate is preferably irradiated with a laser light of an intensity at about 20 mJ/cm$^2$, more preferably a laser light beam of an intensity in a range of 13 to 18 mJ/cm$^2$. Meanwhile, the laser light for scanning, according to the present invention, is used as a light beam of a high-energy, by stepping down the same with the use of a lens, or the like, but there exists a low energy region around the laser light beam. Accordingly, with the present invention, it is possible to make alternate use of the laser light beam of relatively weak energy, and the laser light beam of the high-energy by scanning with the laser light beam containing the light beam of the high-energy, obtained by stepping down the same with the use of the lens, or the like, so that it is possible to provide a total energy ranging from a condition where a change in color appears on the surface to a condition where cracks occur on the surface simply by irradiating the organic compound film over the substrate with the light beam of the high-energy, obtained by stepping down the same with the use of the lens, or the like. For example, a substrate is spin-coated with a solution of an organic compound of metals to be dried at 130° C. in a constant-temperature oven for removal of a solvent, and subsequently, a specimen is fitted to a specimen holder inside a laser chamber, thereafter scanning and irradiating a surface on the opposite side of a coated surface with a laser light at room temperature in the atmosphere, or while controlling an atmosphere or temperature. Further, with the present invention, before or after irradiation with the laser light from a surface, on the opposite side of the surface coated with the solution of the organic compound of the metals for forming the superconductive material, it is also possible to irradiate the surface coated with the solution of the organic compound of the metals for forming the superconductive material with the laser light. Furthermore, the present invention is characterized in that energy ranging from the condition where a change in color appears on the surface to the condition where cracks occur on the surface is irradiated upon irradiation with the laser light. A baking process according to the present invention is broadly classified into respective steps of a drying step, a provisional baking step, and a main baking initial step, and FIG. 3 shows a temperature profile as a typical example although conditions of the respective steps vary on a case-by-case basis.

In the case of fabricating, for example, a YBCO film by scanning and irradiating a film coated with a metalorganic compound, and dried with a laser light, and further, by applying an adequate heat treatment to a film irradiated with the laser light, the following effect has been confirmed. More specifically, it has turned out that if unidirectional scanning and irradiation is executed with laser light in a front-end stage of the provisional baking step (2) for causing the organic components of the organic compound of the metal to undergo thermal decomposition after the step of applying a solution of the metalorganic compound for generating YBCO onto a support body to be subsequently dried (1), this will promote decomposition of the organic components at a low temperature.

Figure 4:
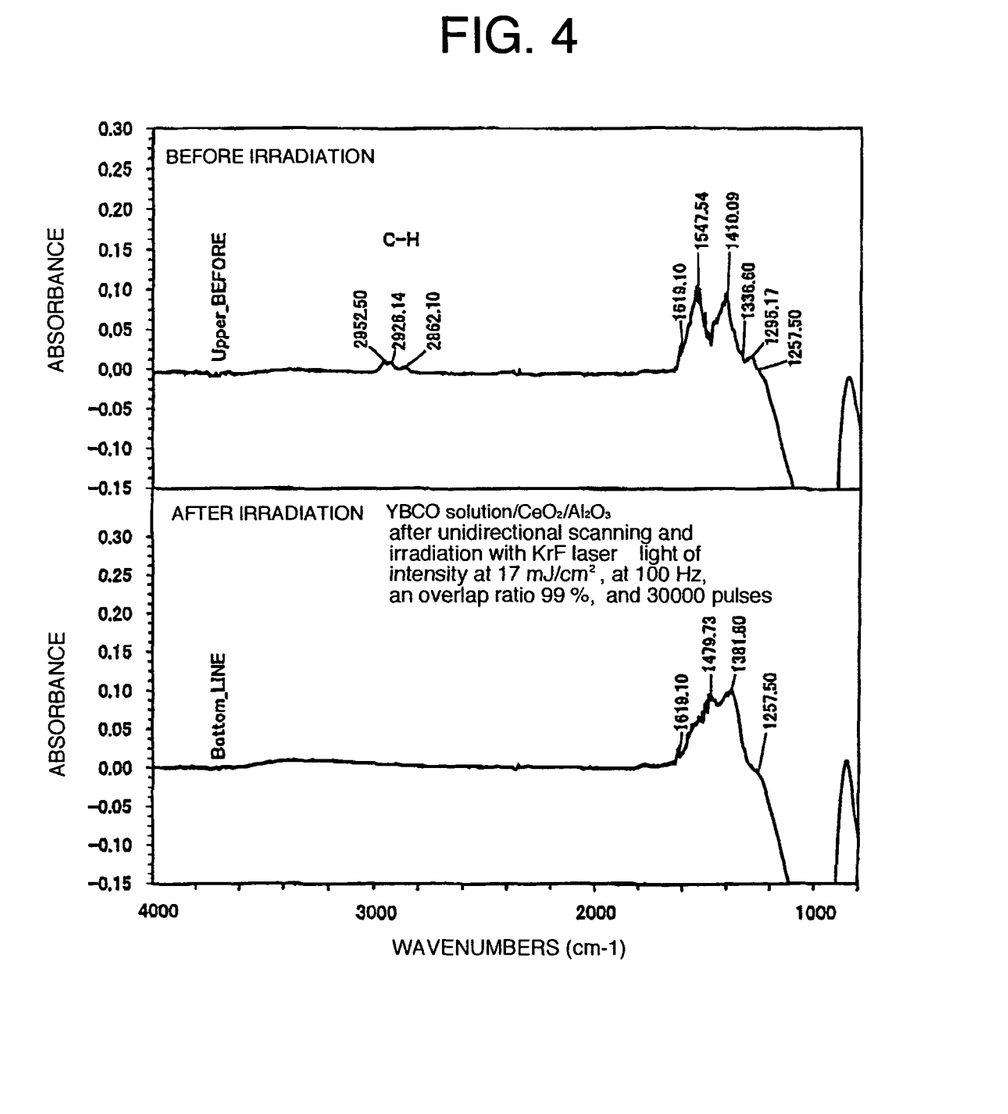
FIG. 4 is a diagram showing results of analysis made on a film irradiated with laser light after the coating and drying process according to the present invention, made with the use of the infrared spectroscopy.

In the case of a conventional coating thermal decomposition method, it has been known that it takes a long time to cause a thermal decomposition reaction of the metalorganic compounds as a raw material for YBCO, however, it has been confirmed that with a method of producing a superconductive material, according to the present invention, the time required in a thermal decomposition reaction process can be shortened. A variation with time of the decomposition reaction occurring in a film coated with a solution of the raw material for YBCO, caused by an excimer laser, was measured by Fourier transform infrared spectroscopy. Results of such a measurement are shown in FIG. 4. The absorbance peak of C—H oscillation in the vicinity of 3000 cm$^{-1}$, pronouncedly seen before irradiation, disappeared after unidirectional scanning and irradiation with a KrF excimer laser light of intensity at 17 mJ/cm$^2$, at 100 Hz, an overlap ratio 99%, and 30000 pulses, thereby proving that the scanning and irradiation with the laser light was effective in the decomposition of the metalorganic compound.

Now, embodiments of the present invention are described in more detail hereinafter, however, it is to be pointed out that the present invention not be not limited to those embodiments. Substrates and solutions for the raw material, used in carrying out the embodiments of the present invention, are described as follows.

(1) a substrate (K1); a commercially available substrate of lanthanum aluminate (LaAlO$_3$) (100), a substrate (K2); a commercially available substrate of strontium titanate (SrTiO$_3$) (100), a substrate (K3); a commercially available substrate of lanthanum-strontium-tantalum-aluminum oxide {(La$_x$Sr$_{1-x}$) (Al$_x$Ta$_{1-x}$) O$_3$} (100), a substrate (K4); a commercially available substrate of neodymium gallate (NdGaO$_3$) (110), a substrate (K5); a commercially available substrate of yttrium aluminate (YAlO$_3$) (110), a substrate (KC1); a substrate with a cerium oxide (CeO$_2$) buffer layer formed on a commercially available substrate of the R-plane of an aluminum oxide (Al$_2$O$_3$) single crystal (sapphire), a substrate (KC2); a substrate with a cerium oxide (CeO$_2$) buffer layer formed on a commercially available substrate of yttria-stabilized zirconia {(Zr,Y) O$_2$, YSZ} (100), a substrate (KC3); a substrate with a cerium oxide (CeO$_2$) buffer layer formed on a commercially available substrate of magnesium oxide (MgO) (100), a substrate (KC4); a substrate with a cerium oxide (CeO$_2$) buffer layer formed on a commercially available substrate of LaAlO$_3$ (100), a substrate (KC5); a substrate with a cerium oxide (CeO$_2$) buffer layer formed on a commercially available substrate of SrTiO$_3$ (100), a substrate (KC6); a substrate with a cerium oxide (CeO$_2$) buffer layer formed on the commercially available substrate of {(La$_x$Sr$_{1-x}$) (Al$_x$Ta$_{1-x}$) O$_3$} (100), a substrate (KC7): a substrate with a cerium oxide (CeO$_2$) buffer layer formed on the commercially available substrate of (NdGaO$_3$) (110), and a substrate (KC8): a substrate with a cerium oxide (CeO$_2$) buffer layer formed on the commercially available substrate of YAlO$_3$ (110). The buffer layer can be formed by the use of any of layer-forming means including, for example, vapor deposition, sputtering, pulsed laser deposition, a coating thermal decomposition method, coating photodecomposition method, sol-gel method, and so forth.

(2) a raw material solution:
(Y1); a solution obtained by dissolving an acetylacetonate containing Y:Ba:Cu at ample ratio of 1:2:3 into a mixed liquid of pyridine and propionic acid, and removing most of the solvent at about 80° C. by use of a vacuum evaporator before re-dissolution into methanol, (YC1); a solution prepared by substituting an acetylacetonate containing Y:Ca:Ba:Cu at the mole ratio of 0.95:0.05:2:3 for the acetylacetonate in the solution (Y1) containing Y:Ba:Cu at the mole ratio of 1:2:3, (Y2); a solution obtained by mixing a toluene solution of salts of Y, Ba, Cu of naphthenic acid such that Y:Ba:Cu will be at the mole ratio of 1:2:3, (Y3); a solution obtained by mixing a toluene solution of 2-ethylhexanoates of Y, Ba, Cu such that Y:Ba:Cu will be at the mole ratio of 1:2:3, (Y4); a solution prepared by substituting trifluoroacetic acid for propionic acid in the solution (Y1), (Y5) a solution obtained by mixing a methanol solution of trifluoroacetates of Y, Ba, Cu such that Y:Ba:Cu will be at the mole ratio of 1:2:3, (D1) a solution prepared by substituting Dy-acetylacetonate for Y-acetylacetonate in the solution Y1, (E1) a solution prepared by substituting Er-acetylacetonate for Y-acetylacetonate in the solution Y1

(3) laser light
(H1) KrF excimer laser light, (H2) XeCl eximer laser light, (H3) ArF eximer laser light Example 1

A surface of the substrate KC1 was spin-coated at 4000 rpm with the coating solution Y1 for 10 seconds, and was dried at 130° C. in a constant-temperature oven for the removal of a solvent to be subsequently irradiated at room temperature by causing the laser light H1 to scan in the longitudinal direction. Provided, however, that the substrate KC1 was irradiated with the laser light H1 from a surface thereof, opposite to the surface coated with a solution of a metal-organic compound of metals for constituting a superconductive material. Irradiation conditions were as follows: room temperature; in the ambient atmosphere; irradiated with the laser light H1 from the surface thereof, on the opposite side of the coated surface; fluence at 74 mJ/cm$^2$; frequency at 100 Hz; an overlapping ratio at 99%; the number of pulses=30,000

Figure 5:
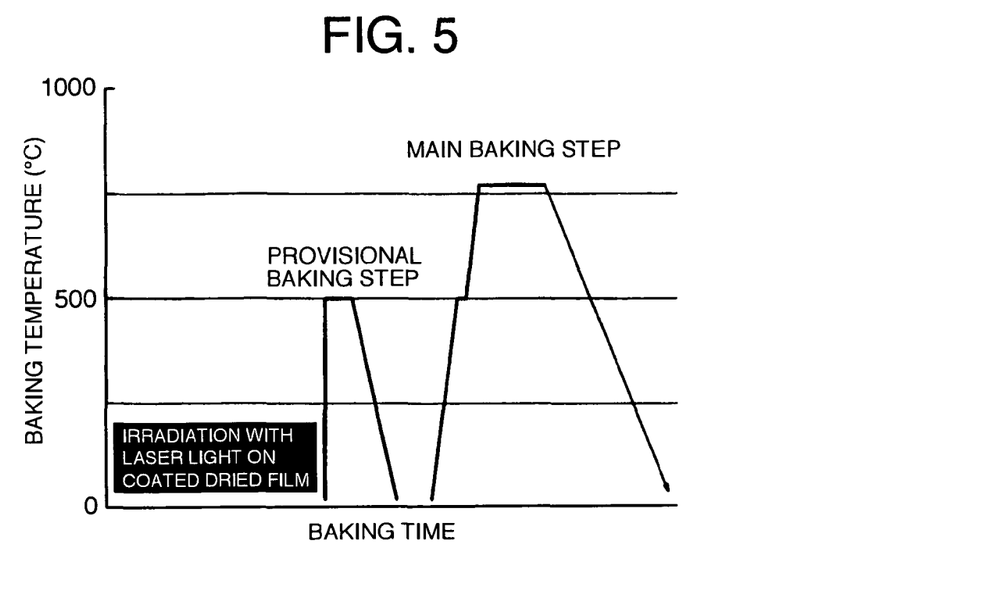
FIG. 5 is a diagram showing a temperature profile in a laser irradiation process, and the baking process after the coating and drying process.

Subsequently, a specimen of the substrate KC1, subjected to the irradiation with the laser light, was inserted into a muffle oven kept at 500° C. beforehand, and was kept at that temperature for 30 minutes before being taken out. Thereafter, main baking was applied thereto in a quartz furnace tubular in shape under the following condition. First, the specimen in a flow of a mixed gas of argon and oxygen with a partial pressure of oxygen adjusted at 100 ppm was heated up to 770° C. at a heating rate of about 16° C./min, and that temperature was kept for 45 minutes before the gas was changed over to pure oxygen to be then held further for 30 minutes, after which the specimen was slowly cooled. FIG. 5 shows a temperature profile in those process steps described. With a YBCO film about 100 nm in film thickness produced as above, a critical current density Jc=7.6 MA/cm$^2$ by an inductive method was obtained. This represented an excellent value considerably in excess of 2.0 to 3.0 MA/cm$^2$, which is regarded as a level in practical use. The surface of a coated film after being irradiated with the laser fight was observed with an optical microscope, and as a result, rhombus-like cracks on the order of 10 μm were observed. The cause of the development of the rhombus-like cracks was presumed that intramolecular bonds of acetylacetonate of metal elements constituting a metalorganic compound (YBCO) making up the coated film, and a residual solvent, such as pyridine, methanol, and propionic acid, were cleaved by irradiation with ultraviolet laser fight to thereby cause a reaction with oxygen in the atmosphere, and low molecular weight compounds (H$_2$O, CO$_2$, CO, etc.) formed underwent inflation, and spouting by laser heating.

Comparative Example 1

With a YBCO film about 100 nm in film thickness produced in the same way as in the case of Example 1 except that the irradiation with the laser light was not applied, the critical current density Jc by the inductive method was found at a measurement limit (0.1 MA/cm$^2$) or lower.

Example 2

With a YBCO film about 100 nm in film thickness produced in the same way as in the case of Example 1 except that use was made of the substrate K1, which was not scanned with laser light, the critical current density Jc=1.2 MA/cm² by the inductive method was obtained.

Example 3

With a YBCO film about 100 nm in film thickness produced in the same way as in the case of Example 1 except that use was made of the substrate K5, there was obtained an a-axis oriented film with in-plane orientation.

Example 4

With a YBCO film about 100 nm in film thickness produced in the same way as in the case of Example 2 except that use was made of the substrate KC3, there was obtained a critical current density Jc=0.6 MA/cm² by the inductive method.

Example 5

With a $Y_{0.95}Ca_{0.05}Ba_2Cu_3O_7$ film about 100 nm in film thickness produced in the same way as in the case of Example 1 except that use was made of the coating solution YC1, there was obtained a critical current density Jc=1.2 MA/cm² by the inductive method.

Example 6

With a YBCO film about 100 nm in film thickness produced in the same way as in the case of Example 1 except that use was made of the coating solution Y2, and the main baking was applied at 740° C., there was obtained a critical temperature Tc=80 K by the inductive method.

Example 7

With a YBCO film about 100 nm in film thickness produced in the same way as in the case of Example 6 except that use was made of the coating solution Y3, there was obtained a critical current temperature Tc=80 K by the inductive method.

Example 8

With a YBCO film about 100 nm in film thickness produced in the same way as in the case of Example 7 except that use was made of the coating solution Y4, there was obtained a critical current density Jc=0.6 MA/cm² by the inductive method.

Example 9

With a YBCO film about 100 nm in film thickness produced in the same way as in the case of Example 7 except that use was made of the coating solution Y5, there was obtained a critical current density Jc=0.6 MA/cm² by the inductive method.

Example 10

With a $DyBa_2Cu_3O_7$ film about 100 nm in film thickness produced in the same way as in the case of Example 7 except that use was made of the coating solution D1, there was obtained a critical current density Jc=1.2 MA/cm² by the inductive method.

Example 11

With a $ErBa_2Cu_3O_7$ film about 100 nm in film thickness produced in the same way as in the case of Example 6 except that use was made of the coating solution E1, there was obtained a critical current density Jc=1.0 MA/cm² by the inductive method.

Example 12

A surface of the substrate KC1 was spin-coated at 4000 rpm with the coating solution Y1 for 10 seconds, was dried at 130° C. in a constant-temperature oven for removal of a solvent and subsequently irradiated at room temperature with the laser light H1, the irradiation being executed such that the fluence is varied in five stages from a low value of 1 mJ/cm² to a high value of 15 mJ/cm², and the number of pulses at respective fluences will total 30,000, as shown in Table 1. The irradiation conditions in other respects were as follows: room temperature; in the ambient atmosphere; frequency at 100 Hz; an overlapping ratio at 99%

TABLE 1

| fluence (mJ/cm²) | the number of pulses | frequency (Hz) |
| --- | --- | --- |
| 1 | 2500 | 100 |
| ↓ | | |
| 3 | 1500 | |
| ↓ | | |
| 5 | 2500 | |
| ↓ | | |
| 10 | 5000 | |
| ↓ | | |
| 15 | 18500 | |

Subsequently, a specimen of the substrate KC1, subjected to the irradiation with the laser light, was inserted into a muffle oven kept at 500° C. beforehand, and was kept at that temperature for 30 minutes before being taken out. Thereafter, main baking was applied thereto in a quartz furnace tubular in shape under the following condition. First, the specimen in a flow of a mixed gas of argon and oxygen with a partial pressure of oxygen adjusted at 100 ppm was heated up to 770° C. at a heating rate of about 16° C./min, and that temperature was maintained for 45 minutes before the gas was changed over to pure oxygen to be then held for a further 30 minutes, after which the specimen was slowly cooled. FIG. 5 shows a temperature profile in those process steps described. With a YBCO film about 100 nm in film thickness produced as above, a critical current density Jc=3 MA/cm² by the inductive method was obtained. This represented a value equivalent to 2.0 to 3.0 MA/cm², which is regarded as the level in practical use. The surface of a coated film after being irradiated with the laser light was observed with an optical microscope, and as a result, rhombus-like cracks on the order of 10 μm were observed.

Example 13

With a YBCO film about 100 nm in film thickness produced in the same way as in the case of Example 12 except that irradiation was executed at respective pulses 10000, 20000, 30000, and 40000 by scanning a specimen in one direction with the laser light at fluence of 16.4 mJ/cm², there was obtained Jc as shown in Table 2.

TABLE 2

| the number of pulses | Jc (MA/cm$^2$) |
|---|---|
| 10000 | 1.2 |
| 20000 | 2.9 |
| 30000 | 6.4 |
| 40000 | 5.9 |

Figure 6:
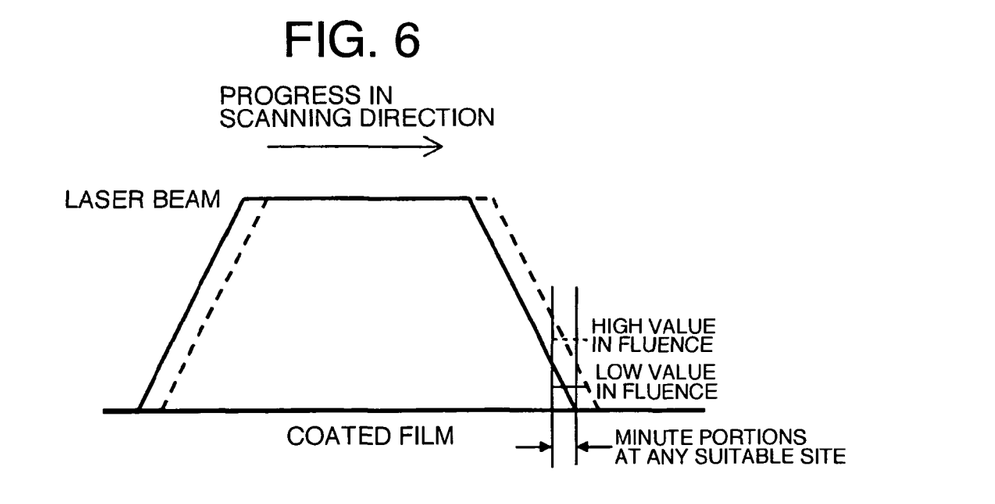
FIG. 6 is a diagram showing a state in which the laser beam is varied in fluence in stages.

In the case of the number of pulses being at 30000, in particular, excellent characteristics of Jc=6.4 MA/cm$^2$ by the inductive method were exhibited. This represented a value considerably in excess of 2.0 to 3.0 MA/cm$^2$, regarded as the level in practical use. This is presumably attributable to the fact that following progress in scanning with the laser beam (as indicated by dotted lines in FIG. 6), minute portions of a coated film, at any suitable site, were continuously irradiated by the laser beam varying in fluence from a low value to a high value. There was observed a tendency that Jc was found on the increase along with an increase in the number of pulses. The surface of the coated film after being irradiated with the laser light was observed with the optical microscope, and as a result, rhombus-like cracks on the order of 10 μm were observed.

Comparative Example 2

With a YBCO film about 100 nm in film thickness produced in the same way as in the case of Example 13 except that irradiation with the laser beam was not executed, Jc by the inductive method was found at the measurement limit (0.1 MA/cm$^2$) or lower.

Example 14

With a YBCO film about 100 nm in film thickness produced in the same way as in the case of Example 12 except that use was made of the substrate K1, and the laser light (fluence of 16.4 mJ/cm$^2$) with the number of pulses, at 30000, there was obtained Jc=1 MA/cm$^2$ by the inductive method.

Example 15

With a YBCO film about 100 nm in film thickness produced in the same way as in the case of Example 14 except that use was made of the substrate K2, there was obtained Jc=1.5 MA/cm$^2$ by the inductive method.

Example 16

With a YBCO film about 100 nm in film thickness produced in the same way as in the case of Example 14 except that use was made of the substrate K3, there was obtained Jc=1.5 MA/cm$^2$ by the inductive method.

Example 17

With a YBCO film about 100 nm in film thickness produced in the same way as in the case of Example 14 except that use was made of the substrate K4, there was obtained an a-axis oriented film with in-plane orientation.

Example 18

With a YBCO film about 100 nm in film thickness produced in the same way as in the case of Example 14 except that use was made of the substrate K5, there was obtained an a-axis oriented film with in-plane orientation.

Example 19

With a YBCO film about 100 nm in film thickness produced in the same way as in the case of Example 14 except that use was made of the substrate K7, there was obtained Jc=2 MA/cm$^2$ by the inductive method.

Example 20

With a YBCO film about 100 nm in film thickness produced in the same way as in the case of Example 14 except that use was made of the substrate K8, there was obtained Jc=0.5 MA/cm$^2$ by the inductive method.

Example 21

With a $Y_{0.95}Ca_{0.05}Ba_2Cu_3O_7$ film about 100 nm in film thickness produced in the same way as in the case of Example 14 except that use was made of the coating solution YC1, there was obtained Jc=1 MA/cm$^2$ by the inductive method.

Example 22

With a YBCO film about 100 nm in film thickness produced in the same way as in the case of Example 14 except that use was made of the coating solution Y2, and the main baking was executed at 740° C., there was obtained Tc=80 K by the inductive method.

Example 23

With a YBCO film about 100 nm in film thickness produced in the same way as in the case of Example 22 except that use was made of the coating solution Y3, there was obtained Tc=80 K by the inductive method.

Example 24

With a YBCO film about 100 nm in film thickness produced in the same way as in the case of Example 22 except that use was made of the coating solution Y4, there was obtained Jc=0.5 MA/cm$^2$ by the inductive method.

Example 25

With a YBCO film about 100 nm in film thickness produced in the same way as in the case of Example 22 except that use was made of the coating solution Y5, there was obtained Jc=0.5 MA/cm$^2$ by the inductive method.

Example 26

With a $DyBa_2Cu_3O_7$ film about 100 nm in film thickness produced in the same way as in the case of Example 22 except that use was made of the coating solution D1, there was obtained Jc=1 MA/cm$^2$ by the inductive method.

Example 27

With a $ErBa_2Cu_3O_7$ film about 100 nm in film thickness produced in the same way as in the case of Example 14 except that use was made of the coating solution E1, there was obtained Jc=0.8 MA/cm$^2$ by the inductive method.

INDUSTRIAL APPLICABILITY

Since the method of producing a superconductive material according to the invention is superior in production efficiency, suitable for mass production and is capable of providing a superconductive material having an excellent superconductivity and large area, the method has technical significance important for commercialization of the superconductive material, so that it has a high industrial applicability.

The invention claimed is:

1. A method of producing a superconductive material, comprising the steps of:
   providing a solution of an organic compound of metals whose oxides form a super conductive material;
   applying the solution onto a surface of a support body;
   irradiating a surface of the support body opposite to the surface on which the solution was applied with a laser light;
   conducting a provisional baking step to cause organic components of the organic compound to undergo thermal decomposition and form oxides of the metals; and
   conducting a main baking step to cause the oxides of the metals to transform into the superconductive material and produce an epitaxially-grown superconductive coating material,
   wherein the support body is a single crystal substrate selected from the group consisting of a $LaAlO_3$ substrate, a $SrTiO_3$ substrate, a $NdGaO_3$ substrate and a $YAlO_3$ substrate or a single crystal substrate, selected from the group consisting of an $Al_2O_3$ substrate, a yttria-stabilized zirconia substrate, a MgO substrate, a $LaAlO_3$ substrate, a $SrTiO_3$ substrate, a $NdGaO_3$ substrate and a $YAlO_3$ substrate, having a $CeO_2$ buffer layer formed thereon.

2. The method of producing a superconductive material according to claim 1, wherein the surface coated with the solution of the organic compound of the metals for forming the superconductive material is irradiated with the laser light before or after the support body is irradiated with the laser light on the opposite surface of the surface coated with the solution of the organic compound of the metals for forming the superconductive material.

3. The method of producing a superconductive material according to claim 1, wherein the total energy of irradiation with the laser light ranges from a condition where a change in color appears on the surface to a condition where cracks occur on the surface being irradiated.

4. The method of producing a superconductive material according to claim 1, wherein upon irradiation with the laser light, a laser beam is set to an intensity in a range of 10 to 100 $mJ/cm^2$ to thereby execute irradiation by scanning the laser light.

5. The method of producing a superconductive material according to claim 1, wherein as the metals, selection is made of at least one element selected from the group consisting of Y and rare earth elements and alkaline earth metals, respectively, and Cu.

6. The method of producing a superconductive material according to claim 1, wherein the organic compound of the metals is at least one organic compound selected from the group consisting of β-diketonate, metal-alkoxides and metal salts of organic acids.

7. The method of producing a superconductive material according to claim 1, wherein the organic compound of the metals is at least one organic compound selected from the group consisting of β-diketonate, metal-alkoxides and metal salts of organic acids containing a halogen.

* * * * *